United States Patent [19]

Boeckmann et al.

[11] Patent Number: 5,093,167
[45] Date of Patent: Mar. 3, 1992

[54] WORKPIECE FOR FORMING CARRIER TAPE

[75] Inventors: Hugo Boeckmann, Arlington Heights; Donald Van Erden, Wildwood, both of Ill.

[73] Assignee: Illinois Tool Works Inc., Cook County, Ill.

[21] Appl. No.: 550,627

[22] Filed: Jul. 10, 1990

Related U.S. Application Data

[60] Division of Ser. No. 195,034, May 17, 1988, Pat. No. 4,958,053, which is a continuation-in-part of Ser. No. 46,259, May 4, 1987, Pat. No. 4,842,135.

[51] Int. Cl.$^5$ ............................................. B65D 73/02
[52] U.S. Cl. ................................. 428/36.9; 428/174
[58] Field of Search ............... 428/36.9, 174; 206/328, 206/332, 334; 220/281

[56] References Cited

U.S. PATENT DOCUMENTS

| | | | |
|---|---|---|---|
| 4,690,274 | 9/1987 | Lue | 206/328 |
| 4,721,206 | 1/1988 | Vötter | 206/328 |
| 4,842,135 | 6/1989 | Borst et al. | 206/328 |

Primary Examiner—James J. Seidleck
Attorney, Agent, or Firm—Kane, Dalsimer, Sullivan, Kurucz, Levy, Eisele and Richard

[57] ABSTRACT

A workpiece for use in forming a carrier tape cover strip is provided with a substantially tubular shaped member having a pair of opposed surfaces. A pair of opposed sidewalls depend from, extend between and connect the opposed surfaces and a longitudinally extending hump is provided on each of the opposed surfaces. The humps comprise identical dovetail configurations in cross section.

4 Claims, 1 Drawing Sheet

WORKPIECE FOR FORMING CARRIER TAPE

CROSS REFERENCE TO RELATED APPLICATIONS

This is a division of application Ser. No. 195,034, filed May 17, 1988, U.S. Pat. No. 4,958,053, which is a continuation-in-part of application Ser. No. 046,259 filed May 4, 1987, U.S. Pat. No. 4,842,135, entitled IMPROVED CARRIER TAPE AND COVER APPLYING AND REMOVAL DEVICES FOR SAME.

BACKGROUND OF THE INVENTION

Carrier tapes are of ever increasing importance in assembly operations in numerous industries including, in particular, the electronic and pharmaceutical industries. The tapes are used, for example, to transport miniature and subminiature electronic components from a component manufacturer to a customer's assembly station where automatic equipment functions to remove the component from the carrier tape and mount the component to a circuit board or the like. The carrier tape (or transfer tape, as it is sometimes referred to) may also function to bring different components to an assembly station in proper order for sequential assembly.

Such carrier tapes are often in the form of a base strip of plastic or paper which is usually covered by a cover strip. The base strip is formed with a plurality of cavities or pockets for the components and the cover strip is secured to the base strip to thereby prevent the components from prematurely falling out of the cavities. In the past the base strip and cover strip were most commonly held in place by an adhesive, heat bound or spaced snap-type fasteners. Typical examples of prior art carrier tapes are disclosed in U.S. Pat. Nos. 3,465,874; 3,650,430; 3,700,019; 3,894,896; 3,910,410; and 4,298,120. The U.S. Pat. Nos. 4,708,245 and 4,733,778 disclose a continuous mechanical interlock between the base strip and cover strip which obviates many of the problems associated with the use of the various prior art methods of securing the base strip and cover strip.

To function properly, a carrier tape must securely convey its cargo as required and then, at the proper location, be capable of being quickly and positively opened so that the component may be easily removed for assembly purposes. The tape should afford a degree of protection for the sensitive components to be conveyed therein with respect to contamination, electrostatic discharge, temperature change and mechanical shock. In addition, the seal or bond between the tape components must be releasable to a known and consistent value at the unloading point to insure that only the required length of base tape will be exposed. Prior art tapes utilizing adhesive or heat bonding techniques present a risk of residue contamination. Further, heat bonding requires the use of relatively high temperatures which may be harmful to the components to be carried. In addition, the use of static-dissipative or conductive additives to prevent or dissipate the build-up of electrostatic charge tends to interfere with the bonding characteristics of adhesives. The previously mentioned application Ser. No. 046,259 discloses an improved carrier tape construction in which the cover strip and base strip are uniformly and consistently secured to one another yet which can readily and positively be separated from one another.

To this end, the carrier tape of the previously mentioned application comprises an elongated base strip and an elongated cover strip both formed of a plastic film material. The base strip is provided with longitudinally spaced cavities for components to be transported therein as well as a series of spaced, longitudinally extending sprocket drive holes for advancing the tape. The cover tape has sidewalls extending downwardly and terminating in upwardly directed barbs or profiles. The spacing between the sidewalls is substantially equal to the width of the base strip. A raised, longitudinally extending hump is provided in the top face of the cover strip aligned with the sprocket holes when the tape is assembled. The hump defines a living hinge for the adjacent surfaces of the cover strip top face. Accordingly, when the hump is depressed the sidewalls of the cover strip move outwardly so as to clear the edges of the base strip and permit removal of the cover strip. Conversely, when the hump is released, the sidewalls return to their relaxed position securely interlocking with the base strip edges. While this construction avoids many of the problems associated with carrier tapes previously available, it introduces other problems. Namely, when such carrier tapes are loaded and shipped, they are commonly wound on a reel or coiled. If the coil is wound too tightly, a force is exerted on the hump of the inner convolutions tending to cause the sidewalls of the cover to move laterally outwardly. In an extreme situation, the cover strip sidewalls may move outwardly sufficiently to disengage from the base strip thereby exposing the component cavities and raising the possibility of some components falling out of their cavities. This, obviously, is not a tolerable situation.

In view of the above, it is the principal object of the present invention to provide an improved carrier tape construction which avoids the use of adhesive and chemical bonding and in which the cover strip and base strip are uniformly and consistently secured to one another even when the carrier tape is wound in a tight coil.

A further object is to provide such a carrier tape wherein the cover strip and base strip may readily and positively be separated from each other during loading and unloading operations.

Still another object is to provide such a carrier tape which may readily be used with existing equipment with little or no modification required.

Yet another object is to provide such a carrier tape which may readily be manually opened and closed so as to facilitate the inspection and replacement of the components carried therein.

A still further object is to provide a method of manufacturing the improved carrier tape of the present invention in a reliable and economic manner.

SUMMARY OF THE INVENTION

The above and other beneficial objects and advantages are attained in accordance with the present invention by providing an improved carrier tape comprising a cover strip and a base strip formed of a plastic material and designed to mechanically interlock with each other. To this end, the cover strip includes a top surface from which opposed sidewalls extend downwardly. The spacing between at least portions of the sidewalls is substantially equal to the width of the base strip so as to engage the sidewalls of the base strip in a firm mechanical interlock. At least one strip, usually the base strip, is provided with a longitudinally extending row of cavities for components or the like. At least one of the sidewalls includes a segment extending outwardly away from the other sidewall so as to define a camming surface onto which a force may conveniently be applied to urge the sidewalls apart and thereby facilitate the application of or removal of the cover strip from the base strip.

The cover strip may further be provided with a hump which, in cross section, has a dovetail configuration. The dovetail configuration is such that when a force is extended directed toward the base strip, such as would be encountered when the carrier tape is tightly wound, the force tends to urge the sidewalls towards each other thereby tightening the retaining force between the cover strip and base strip.

A method is also disclosed for forming the cover strip of the carrier tape. To this end a tubular work piece is extruded and formed so as to have a first surface, a second surface and opposed sidewalls extending between the surfaces. The first and second surfaces are each provided with a longitudinally extending dovetail hump. The sidewalls each include first segments extending inwardly towards the opposite sidewall and second segments extending outwardly away from the opposite sidewall. In a preferred embodiment the first and second surfaces are opposite each other and the sidewall second segments meet at an apex. The apices are served or removed to thereby provide a double length of the cover strip.

DETAILED DESCRIPTION OF THE PREFERRED EMBODIMENT IMPROVED CARRIER TAPE

Figure 1:
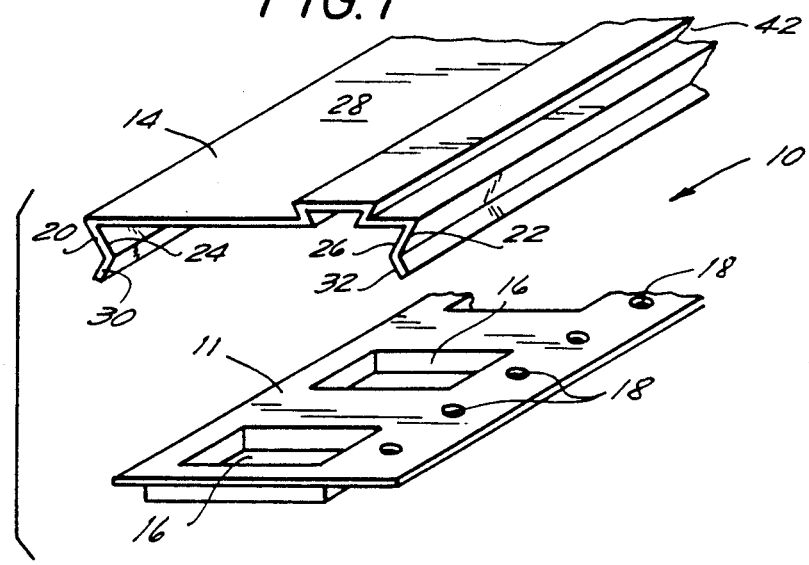
FIG. 1 is a fragmentary, exploded, perspective view of a carrier tape in accordance with the present invention.
Figure 2:
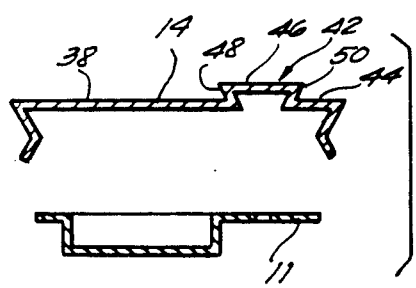
FIG. 2 is an exploded, side elevational sectional view of the carrier tape of FIG. 1.
Figure 4:
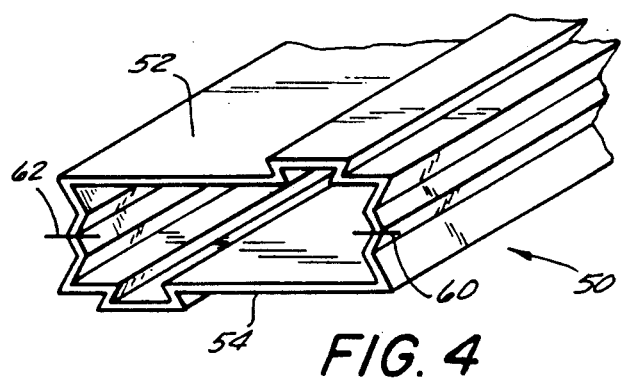
FIG. 4 is a fragmentary perspective view of a work piece from which the cover strip of the carrier tape of FIG. 1 may be formed; and, FIG. 5 is an end elevational view of the work piece of FIG. 4.
Figure 3:
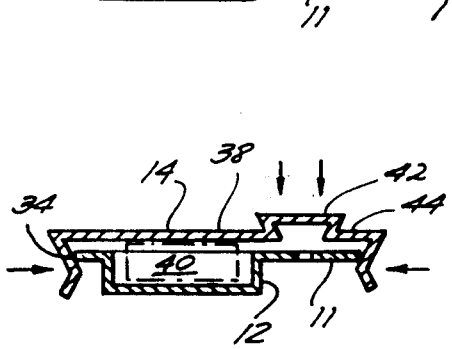
FIG. 3 is a side elevational sectional view of the carrier tape of FIG. 1 as subjected to a force.
Figure 5:
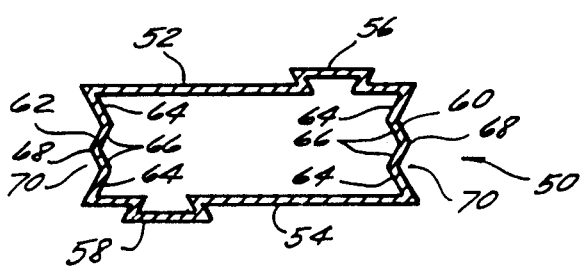

Reference is now made to the drawings and to FIGS. 1-3 in particular wherein a carrier tape 10 is depicted as comprising an elongated base strip and a generally coextensive cover strip 14. The carrier tape 10 is preferably formed of a suitable plastic film material such as carbon loaded polyvinyl chloride, polypropylene or a glycol based polyester such as polyethylene terephthalate (PETG) which may readily be extruded and vacuum or pressure formed to the desired shape. The tape should be sufficiently flexible t permit it to be spooled.

The base 12 is formed with a plurality of cavities 16 which define individual pockets for the components to be conveyed therein. In this regard, the cavities may be contoured, as required, to maintain the components in a particular orientation, should such orientation be necessary. A series of aligned sprocket holes 18 is provided extending through the base strip 12, adjacent to and outward of the cavities 16.

The cover strip 14 is substantially coextensive in length with the base strip. The cover strip 14 is provided, at each side, with a downwardly directed sidewall 20,22. Each of the sidewalls includes an inwardly directed segment 24,26 which extends from the cover top surface 28 and an outwardly directed segment 30,32 which extends from the inwardly directed segment to a free end. The sidewalls are spaced apart from each other so that a portion 34,36 of the inwardly directed segments are separated from each other by a distance substantially equal to the width of the base strip. The height of the sidewalls 20,22 is such that when the cover strip 14 is snapped over the base strip 12 the major face 38 of the cover strip will engage a component 40 within cavity 16 while the portions 34,36 engage the edges of the base strip 12, as shown in FIG. 3.

In accordance with the present invention, the cover strip 14 is further provided with a longitudinally extending dovetail-shaped hump 42 along its entire length. The hump 42 is positioned to align over the line of sprocket holes 18 thereby providing clearance for the sprocket drive wheel of the equipment on which the tape is used. The hump 42 also provides a "living hinge" between the major and minor faces 38,44 of the cover strip defined on opposite sides of the hump 42. To this end, the "living hinge" is biased so that when a downward force is applied to the top face 46 of the hump 42 the inwardly sloped sides 48,50 of the hump along with their attached sidewalls 20,22 will move laterally inwardly toward each other and when the force is removed the sidewalls move laterally outwardly. The extent of inward movement of the sides 48,50 is determined by the downward displacement of the hump which, in turn, is dependent upon the height of the hump as well as the force exerted. Accordingly, when the carrier tape is spooled, the force that each convolution exerts on the convolution beneath it tends to tighten the interlock between the cover strip 14 and base strip 12 as shown in FIG. 3.

The sidewalls 20,22 each terminate in an outwardly directed segment 30,32. These segments provide convenient camming surfaces to permit the cover strip 14 to be removed from the base strip 12 to facilitate inspection or placement of the components 40 within cavities 16. Thus, to remove the cover strip an implement is inserted between the edge of the base and an outwardly directed segment 30 or 32 of the cover strip and an outward force is applied. The force causes the sidewalls to separate thereby permitting the cover strip to be removed from the base. The cover strip may be replaced by simply snapping it into position. Camming surfaces are provided on both sides of the cover strip for convenience.

The cover strip 14 of the present invention may be formed from an extruded work piece 50 which is vacuum or otherwise formed to produce two or more cover strips at the same time. Thus the extruded work piece 50 is formed to provide a top surface 52 and a bottom surface 54. Each of the top and bottom surfaces 52,54 is provided with a longitudinally extending, dovetail-shaped hump 56,58. The top hump 56 is adjacent one sidewall 60 and the bottom dovetail-shaped hump 58 is adjacent the other sidewall 62. The sidewalls each have inwardly directed segments 64 extending from the top or bottom surface and outwardly extending segments 66 which meet at apices 68. By slicing the workpiece 50 along cut lines 70 two cover strips 14 are simultaneously formed.

Thus, in accordance with the above, the aforementioned objectives are effectively attained.

Having thus described the invention, what is claimed is:

1. A workpiece for forming a carrier tape cover strip, said workpiece comprising:
   a substantially tubular shaped member having a pair of opposed surfaces;
   a pair of opposed sidewalls depending from, extending between and connecting said opposed surfaces;
   and a longitudinally extending hump on each of said opposed surfaces positioned between said sidewalls and generally projecting away from said sidewalls, said humps comprising identical dovetail configurations in cross section.

2. The workpiece in accordance with claim 1 wherein said first and second surfaces comprise top and bottom surfaces respectively and one of said top surface sidewalls is contiguous with one of said bottom surface sidewalls and the other of said top surface sidewalls is contiguous with the other of said bottom surface sidewalls.

3. The invention in accordance with claim 2 wherein each of said contiguous sidewalls include first segments which extend inwardly toward the other sidewall from each of the surfaces and second segments which extend outwardly from their associated first segments, said second segments meeting at apices.

4. The workpiece in accordance with claim 2 wherein said first surface hump is adjacent one of said sidewalls and the other surface hump is adjacent the other of said sidewalls.

* * * * *